(12) United States Patent
He et al.

(10) Patent No.: US 11,728,614 B2
(45) Date of Patent: Aug. 15, 2023

(54) SILICON PHOTONICS LIGHT SOURCE

(71) Applicant: Marvell Asia Pte Ltd., Singapore (SG)

(72) Inventors: Xiaoguang He, Diamond Bar, CA (US); Radhakrishnan L. Nagarajan, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 17/895,440

(22) Filed: Aug. 25, 2022

(65) Prior Publication Data

US 2022/0407285 A1 Dec. 22, 2022

Related U.S. Application Data

(63) Continuation of application No. 17/169,037, filed on Feb. 5, 2021, now Pat. No. 11,444,429, which is a continuation of application No. 16/800,974, filed on Feb. 25, 2020, now Pat. No. 10,951,003.

(51) Int. Cl.

| | |
|---|---|
| *H04B 10/00* | (2013.01) |
| *H01S 5/00* | (2006.01) |
| *H01S 5/02* | (2006.01) |
| *H01S 5/323* | (2006.01) |
| *H04B 10/27* | (2013.01) |
| *H04B 10/07* | (2013.01) |
| *G01R 31/26* | (2020.01) |
| *G02B 6/12* | (2006.01) |
| *H01S 5/0234* | (2021.01) |
| *H01S 5/12* | (2021.01) |

(52) U.S. Cl.
CPC ........ *H01S 5/0042* (2013.01); *G01R 31/2635* (2013.01); *G02B 6/12004* (2013.01); *H01S 5/021* (2013.01); *H01S 5/0234* (2021.01); *H01S 5/323* (2013.01); *H04B 10/07* (2013.01); *H04B 10/27* (2013.01); *H01S 5/12* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,977,565 | A * | 11/1999 | Ishikawa | H01L 33/62 257/E27.12 |
| 9,666,677 | B1 * | 5/2017 | Raring | H01L 29/402 |
| 9,871,350 | B2 * | 1/2018 | McLaurin | H01S 5/32341 |

(Continued)

OTHER PUBLICATIONS

U.S. Appl. No. 17/169,037, filed Feb. 5, 2021.
U.S. Appl. No. 16/800,974, filed Feb. 25, 2020.

*Primary Examiner* — Agustin Bello

(57) ABSTRACT

A photonics device includes a silicon wafer including a cathode region, an anode region, a trench region formed between the cathode region and the anode region, and a linear ridge formed between the cathode region and the anode region. A laser diode chip is mounted on the silicon wafer. A conductor layer disposed between the silicon wafer and the laser diode chip includes a first section disposed between the laser diode chip and the cathode region on a first side of the trench to electrically connect the laser diode chip to a cathode electrode of the photonics device and a second section disposed between the anode region and the laser diode chip on a second side of the trench to electrically connect the laser diode chip to an anode electrode of the photonics device.

14 Claims, 9 Drawing Sheets

(56) References Cited

U.S. PATENT DOCUMENTS

| | | | |
|---|---|---|---|
| 10,199,794 B1* | 2/2019 | Yuen | H01S 5/34346 |
| 10,381,801 B1* | 8/2019 | Liang | H01S 5/22 |
| 10,649,137 B1* | 5/2020 | Preisler | G02B 6/136 |
| 10,855,051 B2* | 12/2020 | Möhrle | H01S 5/02375 |
| 10,951,003 B1* | 3/2021 | He | H04B 10/27 |
| 11,211,768 B2* | 12/2021 | Matsumoto | H01S 5/0264 |
| 11,444,429 B2* | 9/2022 | He | H01S 5/021 |
| 2002/0040983 A1* | 4/2002 | Fitzgerald | H01L 21/76256 |
| | | | 257/E27.111 |
| 2002/0074556 A1* | 6/2002 | Kwak | H01L 33/38 |
| | | | 257/79 |
| 2003/0013217 A1* | 1/2003 | Dudoff | H01L 27/1464 |
| | | | 257/E25.032 |
| 2003/0123504 A1* | 7/2003 | Liu | H01S 5/18311 |
| | | | 257/E21.597 |
| 2004/0028312 A1* | 2/2004 | Park | G02B 6/12004 |
| | | | 385/129 |
| 2004/0129949 A1* | 7/2004 | Deliwala | G02B 6/1228 |
| | | | 257/195 |
| 2005/0286583 A1* | 12/2005 | Guenter | H01S 5/0264 |
| | | | 372/50.1 |
| 2006/0109883 A1* | 5/2006 | Lewis | H04N 9/3111 |
| | | | 372/50.12 |
| 2006/0285567 A1* | 12/2006 | Otoma | H01S 5/0261 |
| | | | 372/50.1 |
| 2011/0079809 A1* | 4/2011 | Nomaguchi | H01S 5/12 |
| | | | 257/E33.056 |
| 2011/0227116 A1* | 9/2011 | Saito | H01L 31/1808 |
| | | | 257/E31.011 |
| 2012/0087620 A1* | 4/2012 | Pardo | G02B 6/12019 |
| | | | 228/179.1 |
| 2012/0093190 A1* | 4/2012 | Onishi | H01S 5/12 |
| | | | 438/32 |
| 2013/0223462 A1* | 8/2013 | Olson | H01S 5/04257 |
| | | | 438/42 |
| 2013/0279845 A1* | 10/2013 | Kobrinsky | G02B 6/136 |
| | | | 438/31 |
| 2014/0003765 A1* | 1/2014 | Tseng | H01L 23/48 |
| | | | 438/26 |
| 2014/0079082 A1* | 3/2014 | Feng | H01S 5/101 |
| | | | 372/20 |
| 2014/0264400 A1* | 9/2014 | Lipson | H01L 25/50 |
| | | | 257/432 |
| 2015/0214425 A1* | 7/2015 | Taylor | H01L 27/085 |
| | | | 257/14 |
| 2016/0172253 A1* | 6/2016 | Wu | G01R 31/2635 |
| | | | 335/291 |
| 2016/0261091 A1* | 9/2016 | Santis | H01S 5/1032 |
| 2016/0372893 A1* | 12/2016 | McLaurin | H01S 5/32341 |
| 2017/0207604 A1* | 7/2017 | Watanabe | H01S 5/2272 |
| 2017/0331248 A1* | 11/2017 | Lambert | H01S 5/02257 |
| 2018/0019139 A1* | 1/2018 | Sun | G02B 6/3692 |
| 2018/0219350 A1* | 8/2018 | Möhrle | H01S 5/4031 |
| 2018/0278011 A1* | 9/2018 | Galvano | H01L 24/20 |
| 2019/0107739 A1* | 4/2019 | Yamaji | H01S 5/02326 |
| 2019/0109436 A1* | 4/2019 | Hegblom | H01S 5/18313 |
| 2019/0237936 A1* | 8/2019 | Pao | H01S 5/18369 |
| 2020/0021079 A1* | 1/2020 | Meade | G02B 6/43 |
| 2020/0067270 A1* | 2/2020 | Müller | H01S 5/0239 |
| 2020/0116928 A1* | 4/2020 | Kim | G02B 6/12004 |
| 2020/0116930 A1* | 4/2020 | Kannan | G02B 6/122 |
| 2020/0162156 A1* | 5/2020 | Parker | H01L 31/105 |
| 2020/0274318 A1* | 8/2020 | Matsumoto | G02B 6/12004 |
| 2020/0278426 A1* | 9/2020 | Dummer | G01S 7/4813 |
| 2020/0321753 A1* | 10/2020 | Mueller | H01S 5/3054 |
| 2020/0321754 A1* | 10/2020 | Hegblom | H01S 5/18305 |
| 2020/0335940 A1* | 10/2020 | Huang | H01S 5/0202 |
| 2020/0335942 A1* | 10/2020 | Carson | H01S 5/0234 |
| 2021/0351030 A1* | 11/2021 | Hirikiri | H01L 21/67109 |
| 2022/0029383 A1* | 1/2022 | Hurwitz | H01S 5/02345 |
| 2022/0059993 A1* | 2/2022 | Taylor | H01S 5/18372 |
| 2022/0123522 A1* | 4/2022 | Wang | G02B 27/4205 |
| 2022/0344476 A1* | 10/2022 | Chan | H01L 21/311 |
| 2022/0407285 A1* | 12/2022 | He | H04B 10/07 |

* cited by examiner

SILICON PHOTONICS LIGHT SOURCE

CROSS-REFERENCE TO RELATED APPLICATIONS

This application is a continuation of and claims priority to U.S. patent application Ser. No. 17/169,037, filed Feb. 5, 2021, which is a continuation of and claims priority to U.S. patent application Ser. No. 16/800,974, filed on Feb. 25, 2020 (now. U.S. Pat. No. 10,951,003, issued Mar. 16, 2021), commonly assigned and incorporated by reference herein for all purposes.

BACKGROUND OF THE INVENTION

The present invention relates to optical telecommunication techniques. More particularly, the present invention provides a light source based on integrated silicon photonics, a no-wirebond chip platform that enables wafer level burn-in and testing, and a silicon photonics system having the light source, for applications associated with silicon photonics integrated circuits, though other applications are possible.

New technologies are forcing data centers to scale, service providers to increase bandwidth, and chip manufacturers to seek ways to circumvent Moore's Law. Internet traffic continues to grow exponentially, and communication networks must evolve to meet the need for more and faster data. Emerging technologies such as 5G, the Internet of Things (IoT), and virtual reality place unprecedented demands on data centers to manage higher volumes of traffic and provide faster response times than ever before. Distributed data centers need to communicate with each other to share data, balance workloads, provide backups, and scale capacity when needed. In a campus or metropolitan area, distributed data centers need to increase interconnection capacity significantly. Silicon photonics is a technology that promises a new wave of chips, systems and components to address those needs, while providing lower costs, greater energy efficiency and a smaller form factor. Silicon photonics technology involves creating photonic devices with new optical components on a silicon substrate. Optical-based systems use light to transmit data much faster and more efficiently over fiber optics lines compared to systems that transmit data with electrical signals over copper lines.

Driven along these trends, the demands become stronger on increasing bandwidth for optical communication and decreasing package footprint of a silicon photonics-based optical transceiver. It is more and more challenging to integrate all necessary components including laser-based light source within smaller and smaller module package. In particular, conventional packages using wire bonds to couple driver device with a laser chip lead to impedance mismatch due to large inductance, degrading the signal at higher frequencies. As such, it is not practical to use wire-bond as electrical interconnect between chips or between chips and board for the applications where high frequency (e.g., >40 GHz) analog signal is transmitted. The large inductance of wire bonds has become a bottle neck of high-speed signal transmission.

It is desirable to have an improved light source package based on a no-wirebond chip platform and enabled with wafer-level burn-in and testing for the integrated silicon photonics circuit.

BRIEF SUMMARY OF THE INVENTION

The present invention relates to optical telecommunication techniques. More particularly, the present invention provides a light source based on integrated silicon photonics, a no-wirebond chip platform that enables wafer-level burn-in and testing, and a silicon photonics system having the light source, for applications in integrated silicon photonics, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 3 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides a light source based on integrated silicon photonics. The light source includes a die of a silicon substrate having at least one chip site configured with a surface region, a trench region, and a first stopper region located separately between the surface region and the trench region. The first stopper region is substantially leveled with the surface region and the trench region is configured to be a depth lower than the surface region. Additionally, the light source includes a laser diode chip being flipped with a p-side facing the at least one chip site in the die and a n-side being distal to the chip site. The p-side includes a gain region bonded to the trench region, an electrode region bonded to the surface region, and an isolation region engaged with the stopper region to isolate the gain region from the electrode region. Furthermore, the light source includes a conductor layer in the die of the silicon substrate configured to connect the gain region electrically to an anode electrode and separately connect the electrode region electrically to a cathode electrode.

In a specific embodiment, the present invention provides a testing layout of a plurality of light sources on a silicon wafer. The testing layout includes a silicon handle wafer being patterned with a matrix of dies separated by a grid of boundary regions. Each die has at least one chip site configured with a surface region, a trench region, and a first stopper region located separately between the surface region and the trench region. The first stopper region is substantially leveled with the surface region. The trench region is configured to be a depth lower than the surface region. Additionally, the testing layout includes a plurality of laser diode chips flip-bonded to the matrix of dies. Each laser diode chip has a p-side facing a respective one chip site in a respective die and a n-side being distal to the chip site. The p-side includes a gain region bonded to the trench region, an electrode region bonded to the surface region, and an isolation region engaged with the stopper region to isolate the gain region from the electrode region. Furthermore, the testing layout includes a conductor layer in the respective one die configured to connect the gain region electrically to an anode electrode and separately connect the electrode region electrically to a cathode electrode. Moreover, the testing layout includes an interconnect line formed from the conductor layer extended in a respective one of the grid of boundary regions and configured to connect a cathode electrode of a first die to an anode electrode of a second die that is neighboring to the first die along either a row or a column of the matrix of dies.

In another specific embodiment, the present invention provides a silicon photonics system having the light source as described. The die of the silicon substrate associated with the light source includes two chip sites respectively bonded with two flipped laser diode chips. The light source is coupled electrically to a driver module for generating modulated light signals transmitted via waveguides to a silicon photonics integrated circuit fabricated in the silicon substrate. The light signals are outputted via an input/output module to an optical network. The input/output module is configured to receive optical signals from the optical network and transmitted to the silicon photonics integrated circuit. The optical signals are detected and converted to electrical signals processed via a digital processing module. The driver module and the digital processing module are respective chips mounted on the silicon substrate.

The present invention achieves these benefits and others in the context of known silicon photonics technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
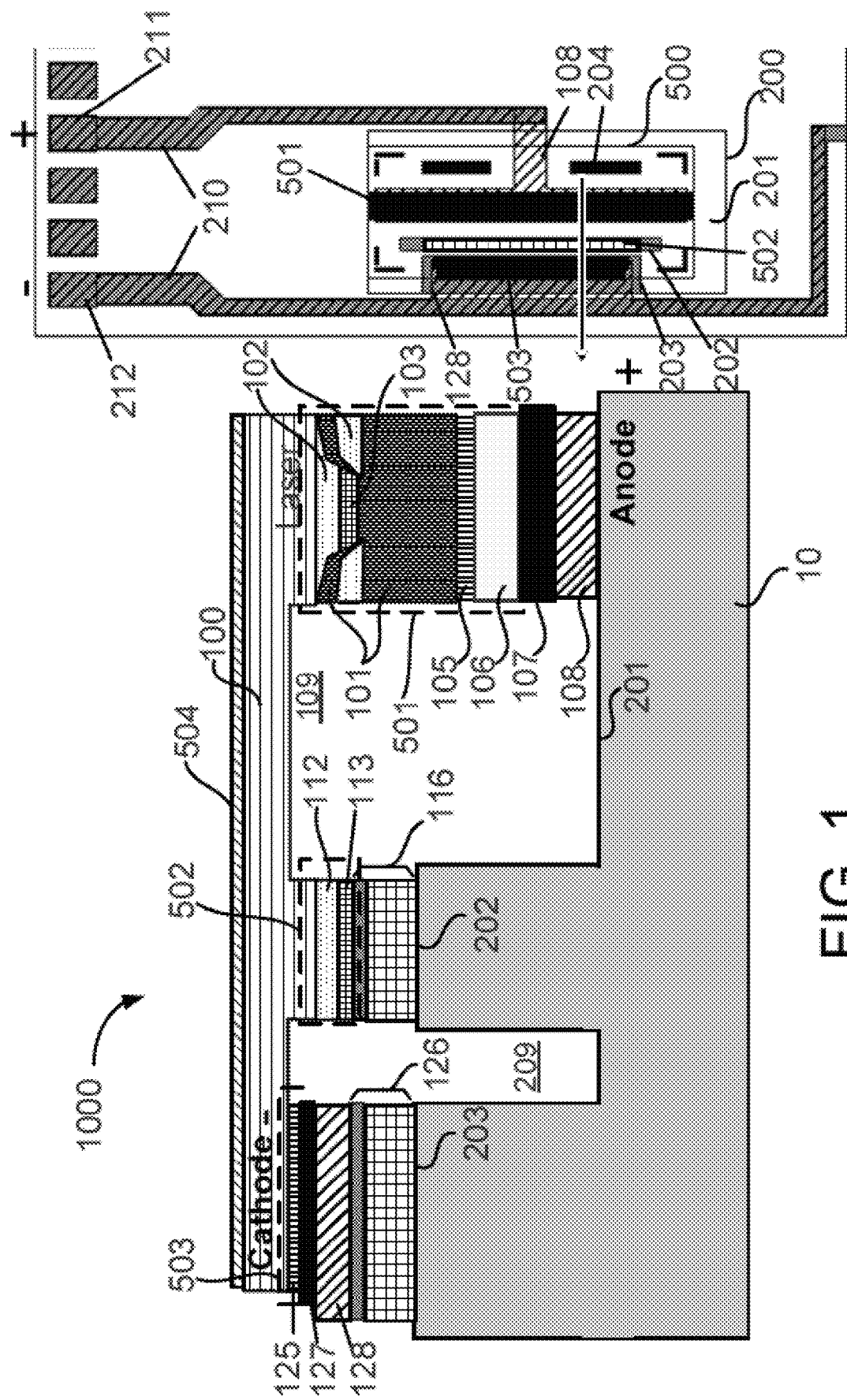
FIG. 1 is a simplified diagram of a light source based on silicon photonics with a cut view according to an embodiment of the present invention.

The present invention relates to optical telecommunication techniques. More particularly, the present invention provides a light source based on integrated silicon photonics, a no-wirebond chip platform that enables wafer-level burn-in and testing, and a silicon photonics system having the light source as described, for applications in integrated silicon photonics, though other applications are possible.

The following description is presented to enable one of ordinary skill in the art to make and use the invention and to incorporate it in the context of applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, flip, opposite, distal, clockwise and counter-clockwise have been used for convenience purposes only and are not intended to imply any particular fixed direction. Instead, they are used to reflect relative locations and/or directions between various portions of an object.

In an aspect, the present disclosure provides a light source with no-wirebond laser chip flip-bonded to silicon for integrated silicon photonics and a wafer layout of a plurality of the light sources of the same platform on a silicon handle wafer facilitating for wafer-level burn-in and testing. As silicon photonics integrated circuits increasingly adopt high-speed photonics devices grown on semi-insulating substrate, an improved, no-wirebonds, monolithic package of light source for integrated silicon photonics can lead to many advantages such as reduced package size and lowered power consumption for high-data-rate communication applications.

FIG. 1 shows is a simplified diagram of a light source based on silicon photonics with a cut view according to an embodiment of the present invention. This diagram is merely an example, which should not unduly limit the scope of the claims. One of ordinary skill in the art would recognize many variations, alternatives, and modifications. As an embodiment shown in FIG. 1, the light source 1000 includes a no-wirebond laser chip 500 flip-bonded on to a chip site 200 in a die of silicon handle wafer 10. Optionally, a die may include one or more chip sites for bonding one or more laser chips. In the present example, only one chip site is shown. The right portion of the figure shows a top sectional view of the chip site 200 including a trench region 201, a first stopper region 202, a surface region 203, as well as a second stopper region 204. The left portion of the figure shows a cut-view along an arrow line in the right portion of the figure. As seen, both the surface region 203 and the first stopper region 202 are substantially at a same level respectively terminated with a silicon-on-insulator layer 126 and 116. While, the trench region 201 is configured to be lower in depth than that of the first stopper region 202 and the surface region 203. The trench region 201 and the surface region 203 are subjected to respectively bond with corresponding gain region 501 and electrode region 503 of a laser diode chip 500 via a conductive solder material while the first stopper region 202 may be engaged with an isolation region 502 of the laser chip.

Referring to FIG. 1, it also shows an under-bump metallization layer 108 being patterned partially overlying a shaped part of the trench region 201 and an under-bump metallization layer 128 being partially overlying the surface region 203. Additionally, a conductor layer 210 is also patterned in linear form in the die of silicon handle wafer 10 overlying the under-bump metallization layer 108 and 128. One section the conductor layer 210 that is coupled to the under-bump metallization layer 108 in the trench region 201 is configured to lead to an anode electrode 211. Another section of the conductor 210 that is coupled to the under-bump metallization layer 128 in the surface region 203, which is electrically isolated from the previous section, is configured to lead to a cathode electrode 212. Optionally, the conductor layer 210 is made by Aluminum. The first stopper region 202 is provided as a linear-shaped ridge structure (referred to left portion of the figure) raised above the trench region 201 separated from the surface region 203 with a first gap 209 and is primarily used for making the surface region 203 and the trench region 201 to be electrically isolated. The second stopper region 204 is also in a linear-shaped ridge structure added to provide passive alignment when the laser chip 500 is flip-bonded to the chip site 200.

Figure 2:
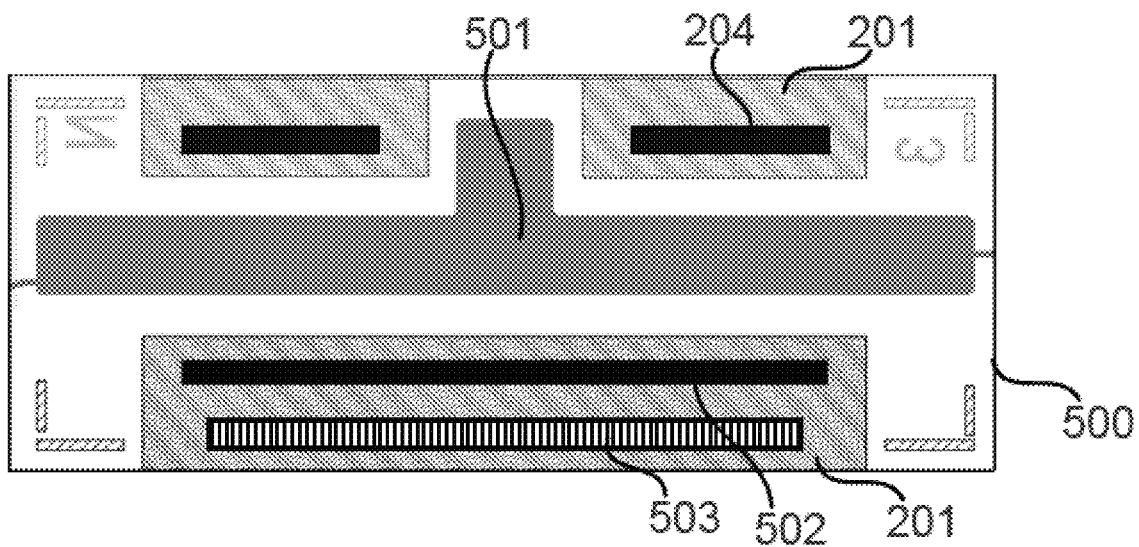
FIG. 2 is a simplified diagram of a p-side of a laser chip in the light source of FIG. 1 according to an embodiment of the present invention.
Figure 3:
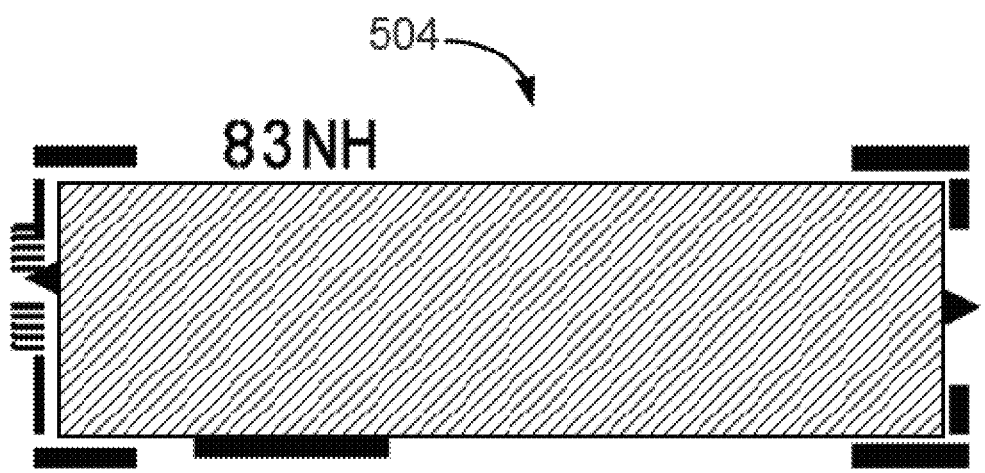
FIG. 3 is a simplified diagram of a contact metal layer configured to be bonded to a n-side of the laser chip of FIG. 2 according to an embodiment of the present invention.

The left portion of the figure (FIG. 1), shows a cut view of the light source 1000 along the arrow line in the right portion of the figure. As shown, the light source 1000 is formed as a laser diode chip 500 is flipped to bond with the chip site 200 in the die of silicon handle wafer 10. The laser diode chip 500 is a device formed on a semiconductor substrate 100 with a p-side and a n-side. Optionally, the semiconductor substrate is an Indium Phosphide substrate for forming an InP-based laser diode. Optionally, the laser diode is a chip applicable to distributed feedback (DFB) laser. Optionally, the laser diode is a chip applicable to Fabry-Perot (FP) laser. Optionally, the laser diode is a chip applicable to any kind of electrical pumped gain media-based laser. Optionally, the laser chip can be heterojunction lasers based on other III-V group materials. The chip 500 is flipped such as the p-side is facing the chip site 200 of the silicon handle wafer in this light source package while the n-side being distal to the chip site. The p-side of the laser diode chip 500 includes a gain region 501, an isolation region 502, and an electrode region 503. Correspondingly, the laser diode chip 500 is configured to be flip-bonded to the chip site 200 laid in the silicon handle wafer 10. FIG. 2 shows a top view of the p-side of the laser diode chip 500 including the gain region 501, the isolation region 502, and the electrode region 503. This diagram is merely an example, which should not unduly limit the scope of the claims. One of ordinary skill in the art would recognize many variations, alternatives, and modifications. Referring both the FIG. 1 and FIG. 2, at least one second stopper region 204 is included in the trench region 201 for supporting passive alignment of the laser diode chip 500 bonded in the chip site 200. Optionally, the second stopper region 204 is a linear-shaped ridge structure substantially in parallel to the first stopper region 202. FIG. 3 shows a top view of the n-side of the laser diode chip 500. This diagram is merely an example, which should not unduly limit the scope of the claims. One of ordinary skill in the art would recognize many variations, alternatives, and modifications. Optionally, the n-side includes a contact metal layer 504 having a good mechanical adhesion and forming a good electric contact to the semiconductor substrate so that it can serve as n-contact for edge emitting laser bar level testing purpose. The specific pattern for the contact metal layer 504 also is served for the flip-chip bonding alignment purpose. Optionally, the contact metal layer is also served as a resistive temperature detector.

Referring back to FIG. 1, the gain region 501 includes a waveguide associated with a PN junction. Optionally, the gain region 501 includes an active layer 103 centered at a shaped n-type indium-phosphide layer 102 and a shaped p-type indium-phosphide layer 101. The shaped n-type indium-phosphide layer 102 overlays the substrate 100. The shaped p-type indium-phosphide layer 101 further caps two sections of the shaped n-type indium-phosphide layer 102 that are separately located at two sides of the active layer 103, The shaped p-type indium-phosphide layer 101 contributes a major portion of the waveguide of a certain length allowing a laser light excited from the active region 103 to be amplified therein. The gain region 501 also includes a contact metal layer 105 overlying the p-type indium-phosphide layer 101, and a bond pad 106 formed on the contact metal layer 105. The contact metal layer 105 establish an ohmic contact with the semiconductor material in the p-type indium-phosphide layer 101. Optionally, the bond pad 106 is made by Gold to provide high electrical conductivity as it is bonded to the corresponding chip site 200. Optionally, the bond pad 106 is bonded to a solder bump 107 disposed over an under-bump metallization layer 108 in the trench region 201. The anode electrode 211 and the cathode electrode 212 are two electrodes for connecting the laser diode to external driver or power supply without any wirebonds in this platform. The gain region 501 with the active layer 103 needs to be aligned optically with a silicon waveguide to output the laser light as the light source 1000 is applied into a silicon photonics integrated circuit.

Referring to FIG. 1, the electrode region 503 includes a contact metal layer 125 laid on the semiconductor substrate 100. The contact metal layer 125 is configured to establish good ohmic contact with the semiconductor substrate 100 and bond to the surface region via a solder bump 127 on an under-bump metallization layer 128 added on the silicon-on-insulator layer 126. The under-bump metallization layer 128 is configured to couple with the conductor layer 210 that leads to the cathode electrode 212. The isolation region 502 includes a n-type indium-phosphide layer 112 overlying the semiconductor substrate 100 and an active layer 113 overlying the n-type indium-phosphide layer 112. Optionally, as the laser diode chip is formed via a separate process on the semiconductor (e.g., InP) substrate, the n-type indium-phosphide layer 112 is formed in the isolation region 502 substantially in a same process as that for forming the n-type indium-phosphide layer 102 in the gain region 501. Similarly, the active layer 113 is formed substantially in a same process as that for forming the active layer 103 in the gain region 501. Afterwards, a second gap 109 is formed by selective etching to separate the active layer 113 overlying the n-type indium-phosphide layer 112 from the active layer 103 and the n-type indium-phosphide layer 102. As the laser diode chip 500 is flip-bonded to the chip site 200, the isolation region 502 is aligned to the first stopper region 202 such that the active layer 113 is engaged with the silicon-on-insulator layer 116. But, there is no electrical contact between the isolation region 502 and the first stopper region 202. The isolation region 502 combined with the first stopper region 202 is separated from the electrode region 503 soldered with the surface region 203 by the first gap 209 and is also separated from the gain region 501 soldered with the trench region 201 by the second gap 109. Each gap is at least >5 µm in separation and yields electrical resistance >10 kΩ. The first gap 209 between the first stopper region 202 and the surface region 203 provides room for possible overflown solder bump 127 applied to the surface region 203. The mutual engagement between the isolation region 502 of the laser diode chip 500 and the first stopper region 202 on the chip site 200 without electrical contact plus the first gap 209 and the second gap 109 ensures free of electrical shorting between the electrode region (led to the cathode) and the gain region (led to the anode) of the laser in this silicon photonics flip-bonding configuration.

Figure 4A:
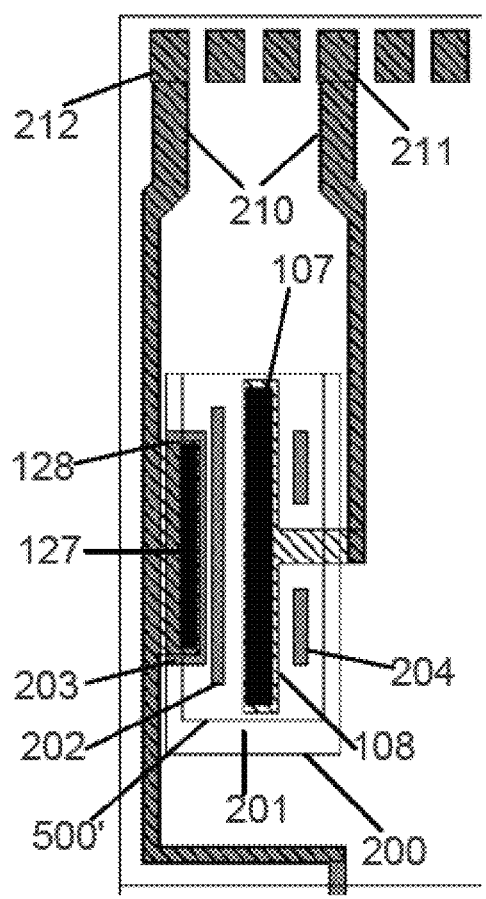
FIGS. 4A and 4B are simplified diagrams of a chip site on a silicon photonics substrate before and after a laser chip is flip-bonded thereon according to an embodiment of the present invention.
Figure 4B:
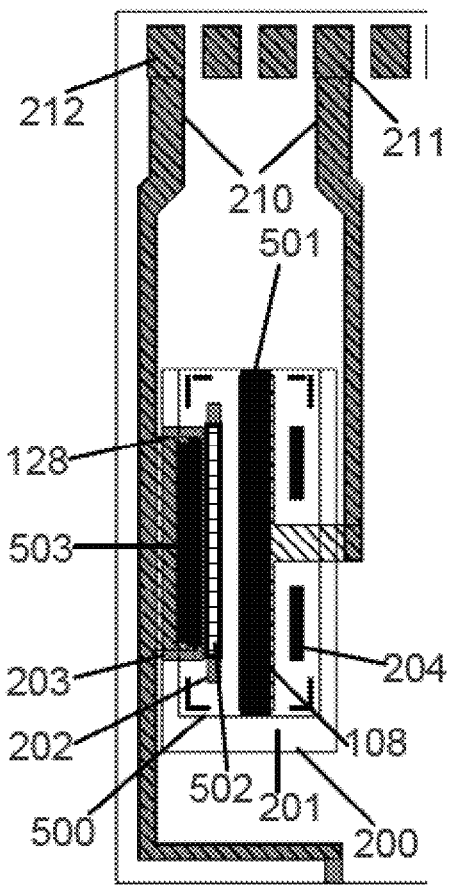

FIGS. 4A and 4B are simplified diagrams of a chip site on a silicon photonics substrate before and after a laser chip is flip-bonded thereon according to an embodiment of the present invention. These diagrams are merely an example, which should not unduly limit the scope of the claims. One of ordinary skill in the art would recognize many variations, alternatives, and modifications. FIG. 4A shows a chip site 200 configured to receive a flip-bonding chip device indicated by an outline 500'. The chip site 200 is processed based on a silicon wafer though other substrate is possible. The silicon wafer includes a surface having a silicon-on-insulator (SOI) layer (or a silicon-on-insulator wafer may be employed here). The silicon wafer is processed to make the chip site 200 with a trench region 201 by removing a portion of silicon material from the surface while keeping a surface region 203, a first stopper region 202, and at least a second stopper region 204 remained to be terminated by the SOI layer. The first stopper region 202 being configured to be a linear-shaped ridge (wall) structure separated from the surface region 203 by a first gap. The second stopper region 204 is also configured to be a linear-shaped ridge structure substantially in parallel to the first stopper region 202 for providing passive alignment to the flip-bonding chip device. The trench region 201 is further formed by adding a T-shaped under-bump metallization layer 108 with its vertical portion extended outside the chip site 200. Optionally, the under-bump metallization layer 108 is formed via electroplating. Additionally, a solder bump 107 is disposed substantially on the horizontal portion of the T-shaped under-bump metallization layer 108. By the same process, an under-bump metallization layer 128 is formed substantially over the surface region 203 and beyond an outline of the chip site 200 and another solder bump 127 is disposed on top of the under-bump metallization layer 128 within the surface region 203. Outside the area of the chip site 200, a conductor layer 210 with patterned structure can be added during the process of adding the under-bump metallization layer 108 and 128. The conductor layer 210 includes multiple isolated sections. One patterned section of the conductor layer 210 is a linear 2D-wire coupled to the under-bump metallization layer 108 outside the trench region 201 to connect the solder bump 107 electrically to an anode electrode 211. Another patterned section of the conductor layer 210 forms a 2D-wire coupled the under-bump metallization layer 128 outside the surface region 203 to connect the solder bump 127 electrically to a cathode electrode 212.

FIG. 4B shows a laser chip 500 is flip-bonded to the chip site 200 described in FIG. 4A. The laser chip 500 has a p-side and a n-side. The p-side, under the flip-bonding platform, is designed to bond with the chip site 200. The p-side includes a gain region 501 configured to bond with the trench region 201 via the solder bump 107 disposed over the horizontal-portion of the T-shaped under-bump metallization layer 108. The p-side also includes an electrode region 503 configured, under the flip-bonding platform, to bond with the surface region 203 via the solder bump 127 disposed over the under-bump metallization layer 128. The p-side further includes an isolation region 502 configured to engage with the first stopper region 202 while keeping the first gap between the first stopper region 202 and the surface region 203 to provide electrical isolation therebetween. The isolation ensures free of electrical shorting between the anode electrode 211 and the cathode electrode 212. Both the anode electrode 211 and the cathode electrode 212 are used to connect the laser diode chip 500 to the laser driver and power supply without any other wirebonds in this platform. The second stopper region 204 provided in the trench region 201 provides support of passive alignment of the laser diode chip 500 under the flip-bonding platform.

Figure 5:
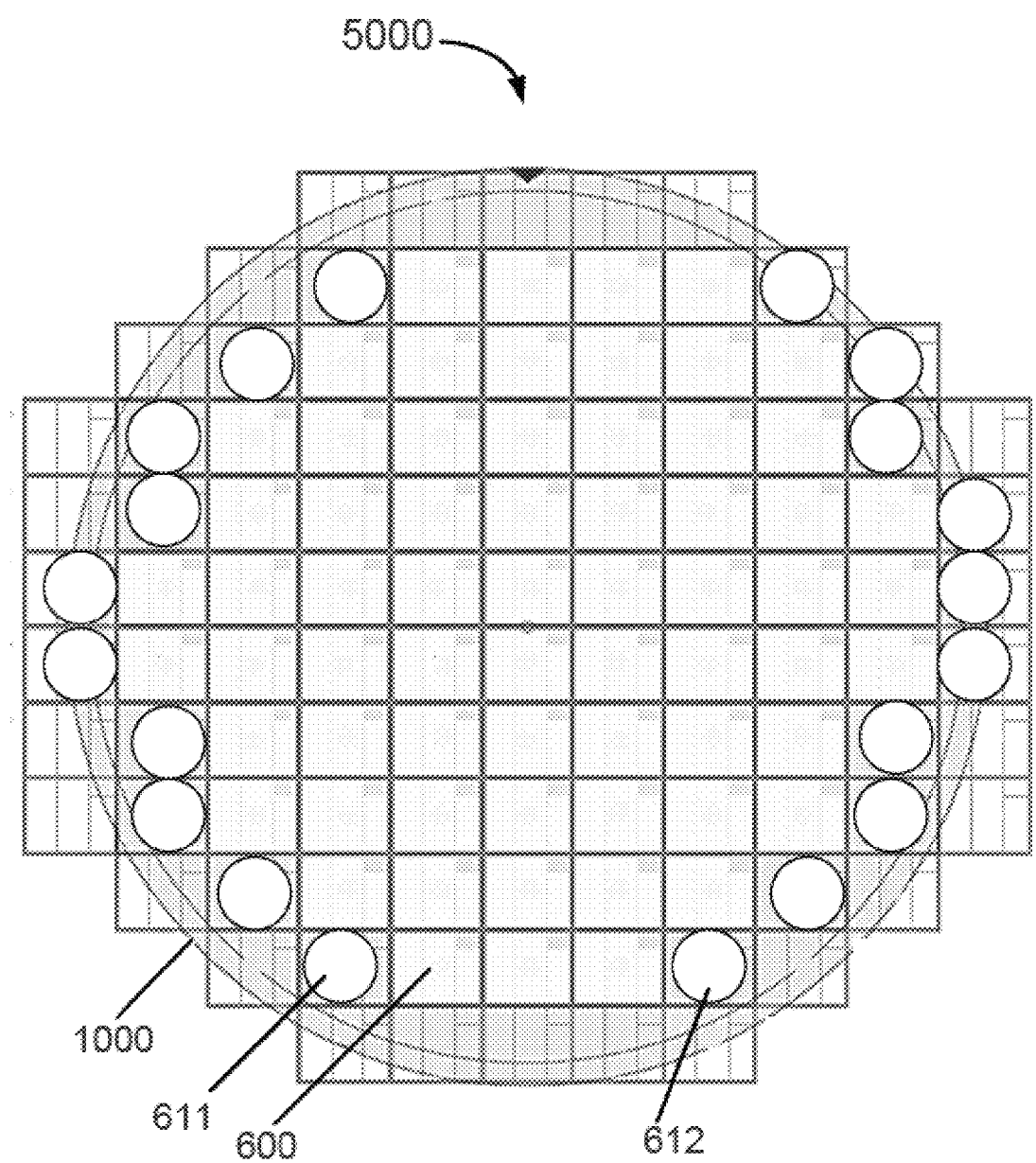
FIG. 5 is a schematic top view of a silicon photonics wafer of multiple reticles configured with multiple chip sites for bonding multiple laser chips with blind probing pads disposed at edge regions for wafer-level burn-in and testing according to an embodiment of the present invention.

In another aspect, the present disclosure provides a wafer layout of a plurality of light sources in same no-wirebond platform on a silicon wafer designed for wafer-level burn-in and testing. FIG. 5 is a schematic top view of a silicon photonics wafer of multiple reticles configured with multiple chip sites for bonding multiple laser chips with blind probing pads disposed at edge regions for wafer-level burn-in and testing according to an embodiment of the present invention. This diagram is merely an example, which should not unduly limit the scope of the claims. One of ordinary skill in the art would recognize many variations, alternatives, and modifications. Referring to FIG. 5, a wafer layout 5000 of a plurality of light sources is provided with multiple reticles 600 arranged in rows and columns across substantially a whole area of the wafer 1000. Each reticle 600 may include multiple dies, though too small in size to be seen explicitly in this figure. Each die may include multiple chip sites. Each chip site is configured to receive one flip-bonding laser diode chip to form a light source based on integrated silicon photonics. Optionally, each die is substantially similar to one chip site 200 described in FIG. 1. Optionally, each laser diode chip that is flip-bonded to the chit site is substantially similar to one chip 500 described in FIG. 1. Optionally, multiple dies are arranged in one or more rows in each reticle 600. Optionally, the multiple dies in each row are connected electrically in series so that the laser chips therein also are connected electrically in series. The wafer layout further includes multiple blind probing pads disposed near edge regions of the wafer 1000 with at least two probing pads 611 and 612 for one row of dies. The probing pads can be added to the silicon photonics wafer at a same process for forming the under-bump metallization layer (108). As a bias current is applied to the corresponding two probing pads 611 and 612, the bias current is flowing through to each laser chip in series across the respective anode electrode and cathode electrode. Bias current can be applied from a tester connected to the two probing pads so that burn-in and testing for the whole row of laser chips can be performed. Similarly, as all the probing pads are employed, wafer-level burn-in and testing can be performed for the whole wafer of the plurality of light sources.

Figure 6:
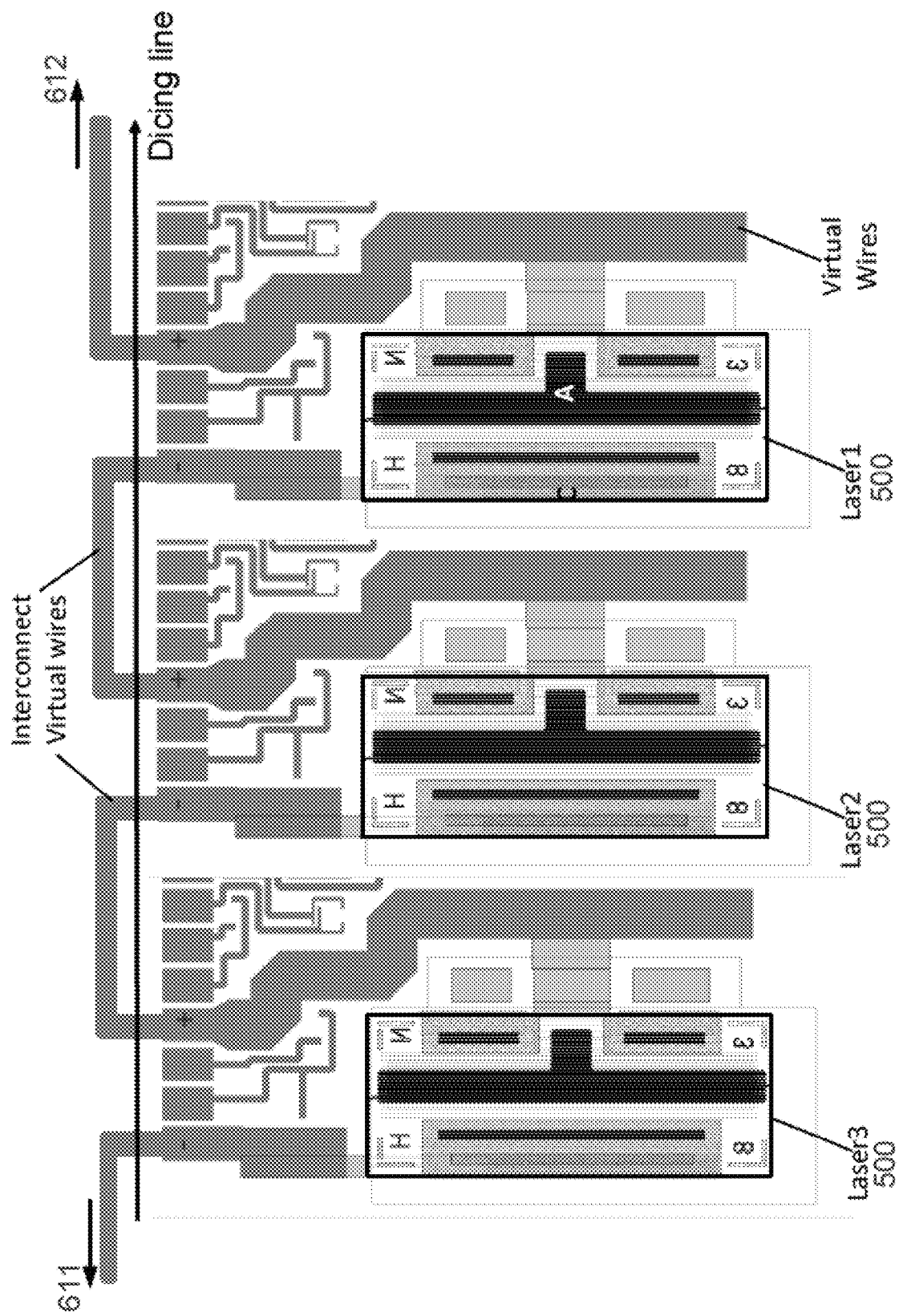
FIG. 6 is a top view of multiple flipped laser chips bonded on respective chip sites in the silicon photonics wafer and connected in series via virtual wires for wafer-level burn-in and testing according to an embodiment of the present invention.

FIG. 6 is a top view of multiple flipped laser chips bonded on respective chip sites in the silicon photonics wafer of FIG. 5 and connected in series via virtual wires for wafer-level burn-in and testing according to an embodiment of the present invention. This diagram is merely an example, which should not unduly limit the scope of the claims. One of ordinary skill in the art would recognize many variations, alternatives, and modifications. As shown in an embodiment, multiple laser chips (respectively flip-bonded to multiple chip sites), including laser1, laser2, and laser3, are arranged in in one row. Each laser chip is connected to its anode electrode and cathode electrode via two independent virtual wires. The anode electrode of one laser chip is subsequently connected to a cathode electrode of a next laser chip in the row via an interconnect virtual wire electrically in series. Eventually, the interconnect virtual wire is connected to the probing pad 611 to the left edge of the wafer and connected to the probing pad 612 to the right edge of the wafer. The virtual wires including the interconnect virtual wires are examples of the interconnect layer 210 shown in FIG. 1. All the interconnect virtual wires are disposed in boundary regions between two neighboring rows of dies beyond each chip site. After successful wafer-level burn-in and testing, each die (containing one or more laser chip) can be diced along the dicing lines to provide individual light source per die for integrated silicon photonics. The interconnect virtual wires beyond the dicing lines are disconnected after dicing.

Figure 7:
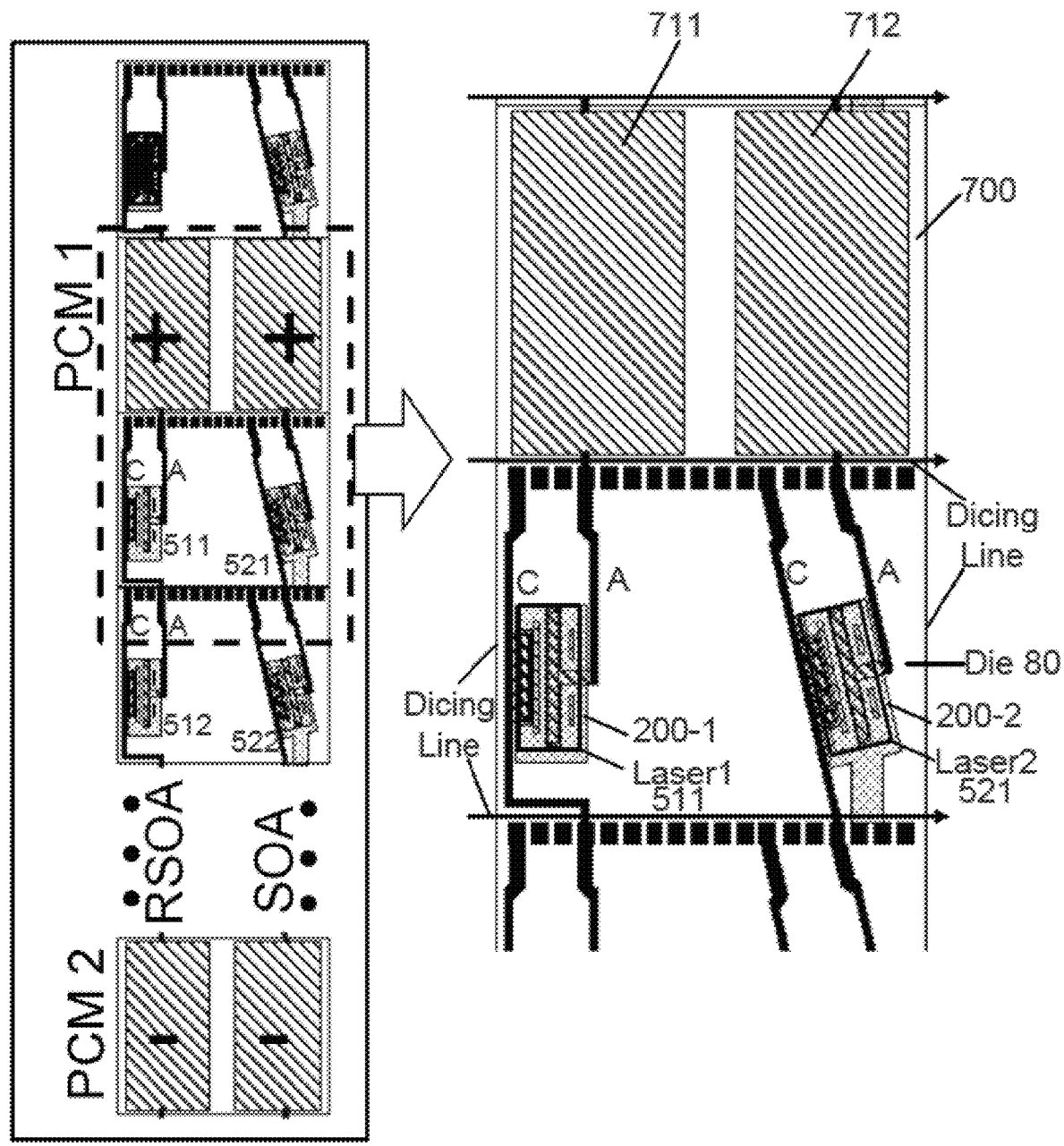
FIG. 7 is a schematic top view of a column of multiple dual-laser units flip-bonded to a column of dies in the silicon photonics wafer and connected respectively in series via virtual wires to probing pads for wafer-level burn-in and testing according to another embodiment of the present invention.

FIG. 7 is a schematic top view of a column of multiple dual-laser units flip-bonded to a column of dies in the silicon photonics wafer and connected respectively in series via virtual wires to probing pads for wafer-level burn-in and testing according to another embodiment of the present invention. This diagram is merely an example, which should not unduly limit the scope of the claims. One of ordinary skill in the art would recognize many variations, alternatives, and modifications. This is another specific embodiment of the wafer layout of a plurality of light sources on silicon wafer. Each light source per die 80 includes two laser chips 511 and 521 forming a dual-laser unit. In a particular application involved with tunable lasers, one laser chip 521 in the die 80 is configured as a semiconductor optical amplifier (SOA) and another laser chip 511 in the die 80 is configured as a reflective semiconductor optical amplifier (RSOA). Optionally, each laser chip, either 511 or 521, is packaged substantially the same as the one laser chip 500 shown in FIG. 1. Optionally, it is an InP-based laser diode. Referring to FIG. 7, multiple RSOA laser chips are arranged in one column with an anode A of a first RSOA laser chip 511 being coupled to a probing pad 711 with a positive bias and a cathode C of the same RSOA laser chip 511 being coupled to another anode A of a next RSOA laser chip 512 in the column, and so on, ended at another probing pad with a negative bias. Similarly, multiple SOA laser chips are arranged in a parallel column with an anode A of a first SOA laser chip 521 being coupled to a probing pad 712 with a positive bias and a cathode C of the same SOA laser chip 521 being coupled to another anode A of a next SOA laser chip 522 in the column, and so on, ending at another proving pad with a negative bias. A constant current serial driver (not shown in the figure) can be disposed between the two probing pad to provide bias current adjustment to perform burn-in and test for the multiple SOA lasers interconnected in series in the column or multiple RSOA lasers interconnected in series in the parallel column.

In an embodiment, the probing pad 711 and 712 are formed during a same process of forming each under-bump metallization layer associated with each chip site in a die. The probing pads with positive bias voltages at one end of the two columns are placed at a first process control monitor (PCM1) site 700 designed for performing wafer-level burn-in and testing of the laser chips in the respective two whole columns. Optionally, the probing pads with negative bias voltages at the other end of the two columns are placed at a second process control monitor (PCM2) site.

In another embodiment, each of the interconnect wires connecting the first laser chip to the probing pad or a second laser chip and so on is an example of interconnect layer 210 shown in FIG. 1 located in a boundary region between neighboring dies. Optionally, the interconnect wires are made by Aluminum. Referring to FIG. 7, a dicing line is laid along the boundary region to cut through the interconnect wires. Once the wafer-level burn-in and testing is done, each die 80 can be diced out along the dicing line where the interconnect wires are served as disposable virtual wires.

Figure 8:
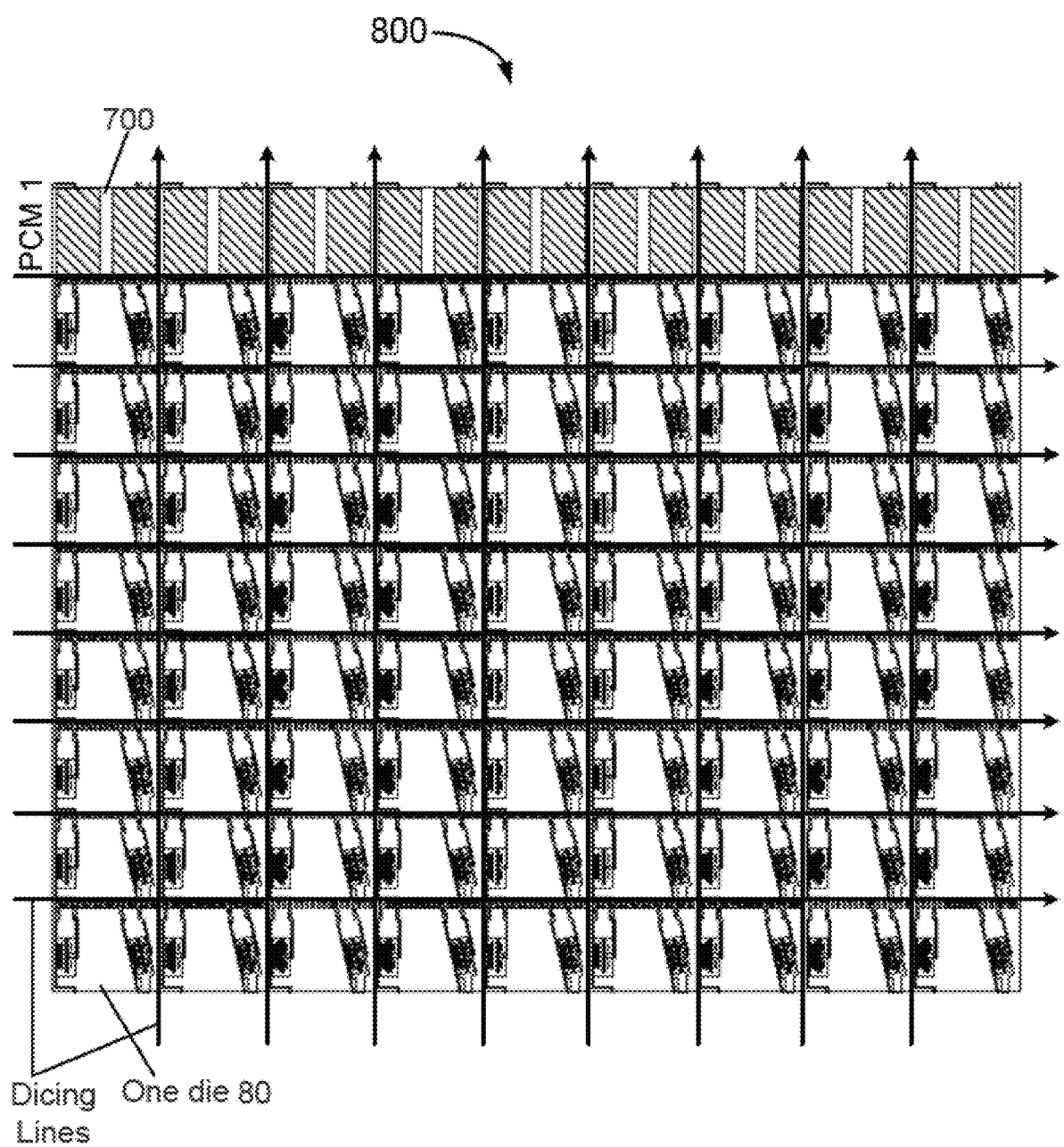
FIG. 8 is a schematic top view of a reticle of multiple columns of dual-laser units connected in series via virtual wires to probing pads respectively at one end of each column according to the embodiment of the present invention.

FIG. 8 is a schematic top view of a reticle of multiple columns of dual-laser units connected in series via virtual wires to probing pads respectively at one end of each column according to the embodiment of the present invention. This diagram is merely an example, which should not unduly limit the scope of the claims. One of ordinary skill in the art would recognize many variations, alternatives, and modifications. As shown, a reticle 800 of a wafer layout includes a matrix of dies separated by a grid of boundary regions, each die having two chip sites configured to form a dual-laser light source for integrated silicon photonics. Each column of dies 80 in the reticle 800 is substantially the same one shown in FIG. 7, i.e., electrically connected in series to couple two PCM based probing pads 700 (only one at the top end of each column is shown) to a constant current serial driver configured to provide bias current adjustment for testing each laser chip flip-bonded to a chip site in each of the column of dies.

Figure 9:
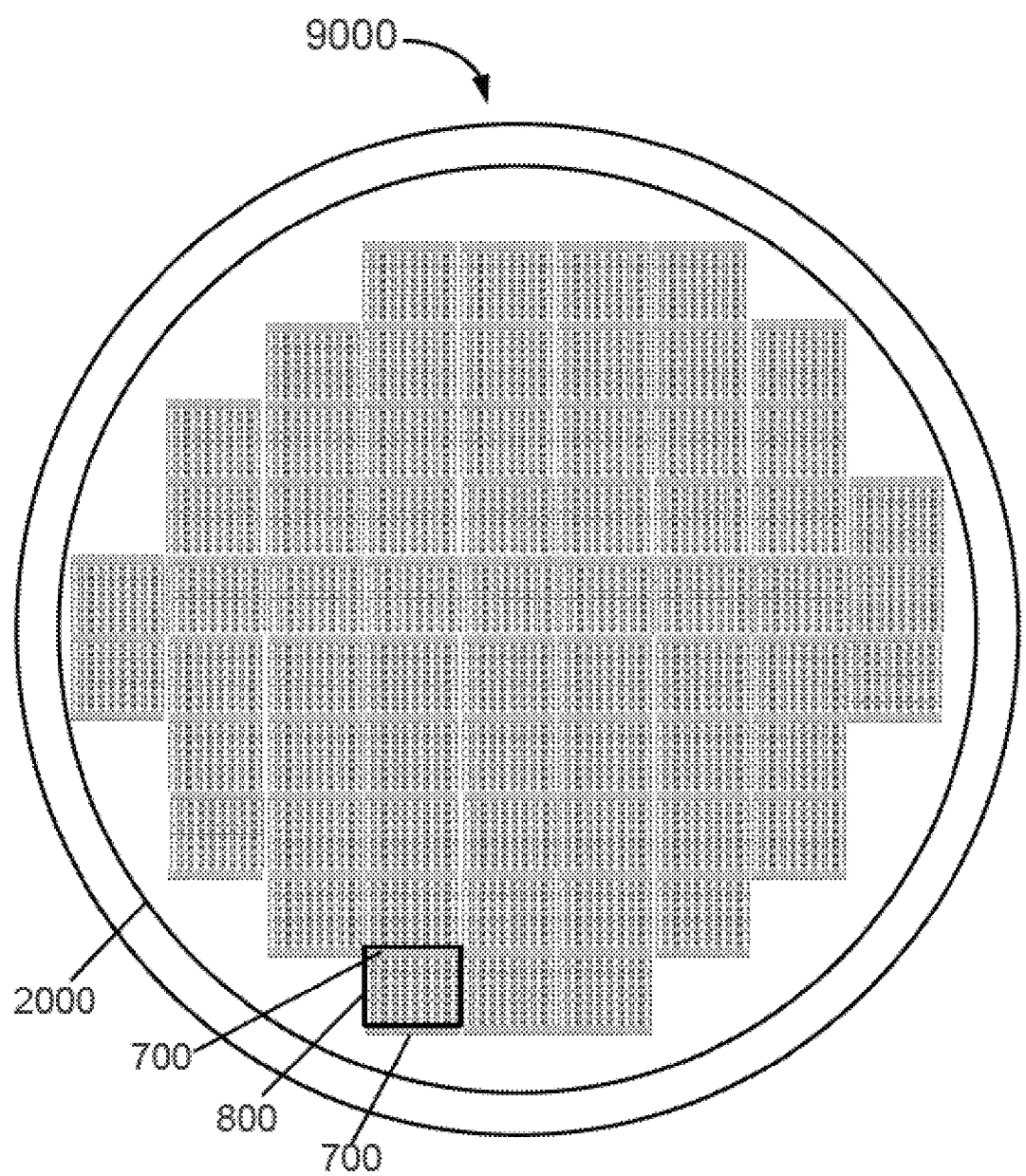
FIG. 9 is a schematic top view of a wafer layout of multiple reticles of FIG. 8 arranged in a matrix with the respective probing pads distributed evenly across the wafer according to the embodiment of the present invention.

FIG. 9 is a schematic top view of a wafer layout of multiple reticles of FIG. 8 arranged in a matrix with the respective probing pads distributed evenly across the wafer according to the embodiment of the present invention. This diagram is merely an example, which should not unduly limit the scope of the claims. One of ordinary skill in the art would recognize many variations, alternatives, and modifications. Referring to FIG. 9, this wafer layout 9000 includes multiple reticles 800 of FIG. 8 arranged in a matrix with multiple rows and columns in a silicon wafer 2000. Each reticle 800 has multiple columns of dies. Each column of die includes a pair or probing pads 700 respectively at two ends thereof. Each die includes two chip sites configured to bond two flipped laser chips forming a dual-laser light source for integrated silicon photonics. In the embodiment, multiple probing pads 700 associated with the matrix of reticles are evenly distributed in process control monitor (PCM) sites across the wafer 2000. Theses probing pads distributed at PCM sites allow uniform pressing force applied to the wafer to avoid wafer warping and enhance thermal contact of the wafer with a heat sink underneath the wafer. Also, the PCM sites are designed to connect electrically to multi-device testers capable of adjusting bias voltage independently to perform wafer-level burn-in and testing conveniently and efficiently.

Figure 10:
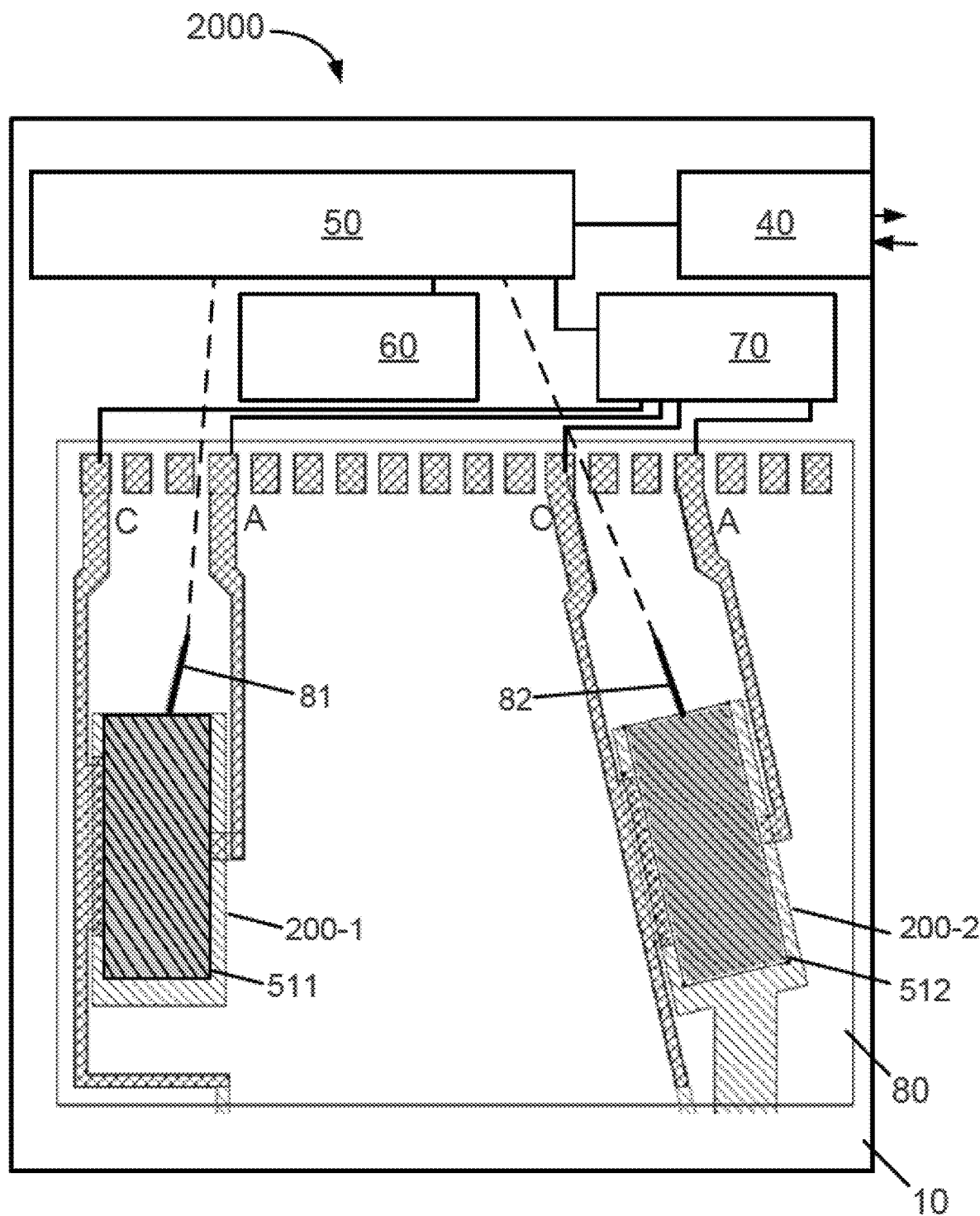
FIG. 10 is a schematic top view of a silicon photonics system with two laser chips flip-bonded on two co-planner chip sites and coupled to respectively waveguides in a silicon photonics device according to an embodiment of the present invention.

In yet another aspect, the present disclosure provides a silicon photonics system based on the light source of the present disclosure. FIG. 10 is a schematic top view of a silicon photonics system with a light source having two laser chips flip-bonded on two co-planner chip sites and coupled to respectively waveguides in a silicon photonics device according to an embodiment of the present invention. This diagram is merely an example, which should not unduly limit the scope of the claims. One of ordinary skill in the art would recognize many variations, alternatives, and modifications. Referring to FIG. 10, the silicon photonics system 2000 includes a light source 80 formed by flip-bonding two laser diode chips 511 and 512 onto two chip sites 200-1 and 200-2 in the Silicon wafer 10 in such a configuration to align its laser outputs respectively to two waveguides 81 and 82. The silicon photonics system further includes a driver module 70 electrically to respective anodes A and cathodes C of the two laser chips 511 and 512. Optionally, the driver module 70 is a chip mounted on the silicon wafer 10 to control the laser generation and signal modulation. The waveguides 81 and 82 are directly linked or combined first then linked to deliver laser signals to a silicon photonics integrated circuit 50 fabricated in the silicon wafer 10. Optionally, the silicon photonics integrated circuit 50 includes a plurality of passive or active components including power splitter, combiner, interferometer, modulator, multiplexer, polarization device, amplifier, and detector, etc., depending on functionalities of the silicon photonics system. The light signals generated by the laser chips 511 and 512 are processed by the silicon photonics integrated circuit 50 and outputted through an input/output module 40 in the silicon wafer 10 and optionally coupled to external network via optical fibers. In another embodiment, the silicon photonics system 2000 also is configured to receive optical signals coming from network externally through the input/output module 40. The received optical signals then are processed and detected by the silicon photonics integrated circuit 50 and converted to electrical signals which can be digitalized and processed by a digital processing module 60. Optionally, the digital processing module 60 is a chip mounted on the silicon wafer 10.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A photonics device, comprising:
   a silicon wafer including a cathode region, an anode region, a trench region formed between the cathode region and the anode region, and a linear ridge formed between the cathode region and the anode region, wherein the trench region has a lower depth than the cathode region, the anode region, and the linear ridge;
   a laser diode chip mounted on the silicon wafer; and
   a conductor layer disposed between the silicon wafer and the laser diode chip, the conductor layer including (i) a first section disposed between the laser diode chip and the cathode region on a first side of the trench region to electrically connect the laser diode chip to a cathode electrode of the photonics device and (ii) a second section disposed between the anode region and the laser diode chip on a second side of the trench region to electrically connect the laser diode chip to an anode electrode of the photonics device.

2. The photonics device of claim 1, wherein the laser diode chip includes (i) an electrode region bonded with the cathode region to electrically couple the laser diode chip to the cathode region, (ii) a gain region bonded with the anode region to electrically couple the laser diode chip to the anode region, and (iii) an isolation region between the electrode region and the gain region and bonded with the linear ridge, the isolation region being configured to electrically isolate the gain region from the electrode region.

3. The photonics device of claim 2, wherein (i) the first section of the conductor layer electrically connects the electrode region to the cathode electrode of the photonics device and (ii) the second section electrically connects the gain region to the anode electrode of the photonics device, the first section being electrically isolated from the second section by the isolation region.

4. The photonics device of claim 1, wherein the silicon wafer includes an upper surface region, the upper surface region including the cathode region and the first section of the conductor layer, and wherein the laser diode chip is bonded to the upper surface region.

5. The photonics device of claim 4, the linear ridge being configured to electrically isolate the upper surface region from the trench region.

6. The photonics device of claim 1, wherein the laser diode chip is flip-bonded onto the silicon wafer without wire bonding between the laser diode chip and the cathode region, the anode region, and the linear ridge.

7. The photonics device of claim 1, further comprising a first bond pad disposed in the cathode region, wherein the first section of the conductor layer is disposed on the first bond pad.

8. The photonics device of claim 7, further comprising a second bond pad disposed in the anode region, wherein the second section of the conductor layer is disposed on the second bond pad.

9. The photonics device of claim 8, further comprising a first metallization layer disposed below the first bond pad and the first section of the conductor layer and a second metallization layer disposed below the second bond pad and the second section of the conductor layer.

10. The photonics device of claim 8, further comprising a first solder bump bonding the first bond pad to the first section of the conductor layer and a second solder bump bonding the second bond pad to the second section of the conductor layer.

11. The photonics device of claim 10, further comprising (i) a first gap defined between the cathode region and the linear ridge and (ii) a second gap, different from the first gap, defined between the linear ridge and the anode region, wherein the first gap and the second gap are configured to accommodate overflow of the first solder bump and the second solder bump to maintain electrical isolation between the cathode region, the linear ridge, and the anode region.

12. The photonics device of claim 1, wherein the silicon wafer includes a plurality of chip sites and the laser diode chip is bonded to one of the plurality of chip sites.

13. The photonics device of claim 12, further comprising a plurality of the laser diode chips bonded to respective ones of the plurality of chip sites.

14. The photonics device of claim 1, wherein a p-side of the laser diode chip faces the silicon wafer and an n-side of the laser diode chip faces away from the silicon wafer.

* * * * *